(12) United States Patent
Kisela et al.

(10) Patent No.: US 7,653,842 B2
(45) Date of Patent: Jan. 26, 2010

(54) CRC FORMAT AUTOMATIC DETECTION AND SETTING

(75) Inventors: James W Kisela, Snohomish, WA (US); Mike Treseler, Edmonds, WA (US)

(73) Assignee: Fluke Corporation, Everett, WA (US)

( * ) Notice: Subject to any disclaimer, the term of this patent is extended or adjusted under 35 U.S.C. 154(b) by 647 days.

(21) Appl. No.: 11/013,652

(22) Filed: Dec. 15, 2004

(65) Prior Publication Data

US 2006/0156176 A1    Jul. 13, 2006

(51) Int. Cl.
*G06F 11/00* (2006.01)

(52) U.S. Cl. .................. 714/703; 714/704; 714/724; 714/52; 714/781

(58) Field of Classification Search .............. 714/781, 714/703, 704, 799, 724
See application file for complete search history.

(56) References Cited

U.S. PATENT DOCUMENTS

| | | | | |
|---|---|---|---|---|
| 4,316,284 A * | 2/1982 | Howson | ............... | 370/512 |
| 5,383,202 A * | 1/1995 | Edgar et al. | ............... | 714/746 |
| 6,097,732 A * | 8/2000 | Jung | ............... | 370/466 |
| 6,226,771 B1 * | 5/2001 | Hilla et al. | ............... | 714/758 |
| 6,810,501 B1 * | 10/2004 | Ferguson et al. | ............... | 714/781 |
| 7,155,658 B2 * | 12/2006 | Huffman et al. | ............... | 714/776 |
| 7,216,285 B2 * | 5/2007 | Chen | ............... | 714/781 |
| 7,260,765 B2 * | 8/2007 | Hickey et al. | ............... | 714/779 |
| 2003/0026282 A1 * | 2/2003 | Gross et al. | ............... | 370/430 |
| 2003/0026292 A1 * | 2/2003 | Abrol et al. | ............... | 370/470 |
| 2006/0005102 A1 * | 1/2006 | Scaglione et al. | ............... | 714/758 |

* cited by examiner

*Primary Examiner*—Esaw T Abraham
(74) *Attorney, Agent, or Firm*—patenttm.us

(57) ABSTRACT

An automatic CRC format detection and selection device observes FCS errors during an interval, incrementing counts thereof. When a determination is made that an error count threshold has been met, the CRC format may be automatically changed in order to enable CRC format detection and switching without requiring a user to have knowledge of the format or how to accomplish its change.

16 Claims, 2 Drawing Sheets

CRC FORMAT AUTOMATIC DETECTION AND SETTING

BACKGROUND OF THE INVENTION

This invention relates to data transmission, and more particularly for a method and apparatus for detecting the CRC format in Wide Area Network (WAN) monitoring, for example.

In Wide Area Network communication, for example with the PPP protocol, a cyclic redundancy code (CRC) is employed for error detection. The sender of a data frame calculates the CRC and includes the calculated value with the frame of data. At the receiving end, the receiver calculates the CRC based on the data and compares the calculated value with the CRC value sent by the sender.

Current practices employ both 16 bit and 32 bit CRC. It is important that the same type of CRC be employed by both the sender and the receiver of the data, in order for the error detection to operate as designed. Particularly in the case of network test and monitoring equipment, wherein a particular instrument may be used on many different specific types of networks, or may be installed by persons not familiar with the particular network or protocol configurations, the particular form of CRC that is in use may be unknown.

In accordance with the prior art, it was necessary to manually select either 16 or 32 bit CRC format with monitor and test equipment, requiring the user to have knowledge of the CRC format in use and to have the skill to make the setting properly. An incorrect CRC format would make an analyzer or other test instrument unusable.

SUMMARY OF THE INVENTION

In accordance with the invention, a method and apparatus are provided for automatically selecting either 16 or 32 bit CRC format. A counter is employed to count consecutive frame check sequence (FCS) errors, and that counter is watched in order to make a determination whether the CRC format setting is either acceptable or needs to be changed.

Accordingly, it is an object of the present invention to provide an improved system and method for determining the CRC format of a network under test.

It is a further object of the present invention to provide an improved WAN analyzer instrument that automatically detects and sets the correct CRC format.

It is yet another object of the present invention to provide an improved method to determine and set the CRC format without requiring user knowledge or intervention.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

The system according to a preferred embodiment of the present invention comprises a WAN analyzer that incorporates the inventive CRC format detection method and apparatus.

Figure 1:
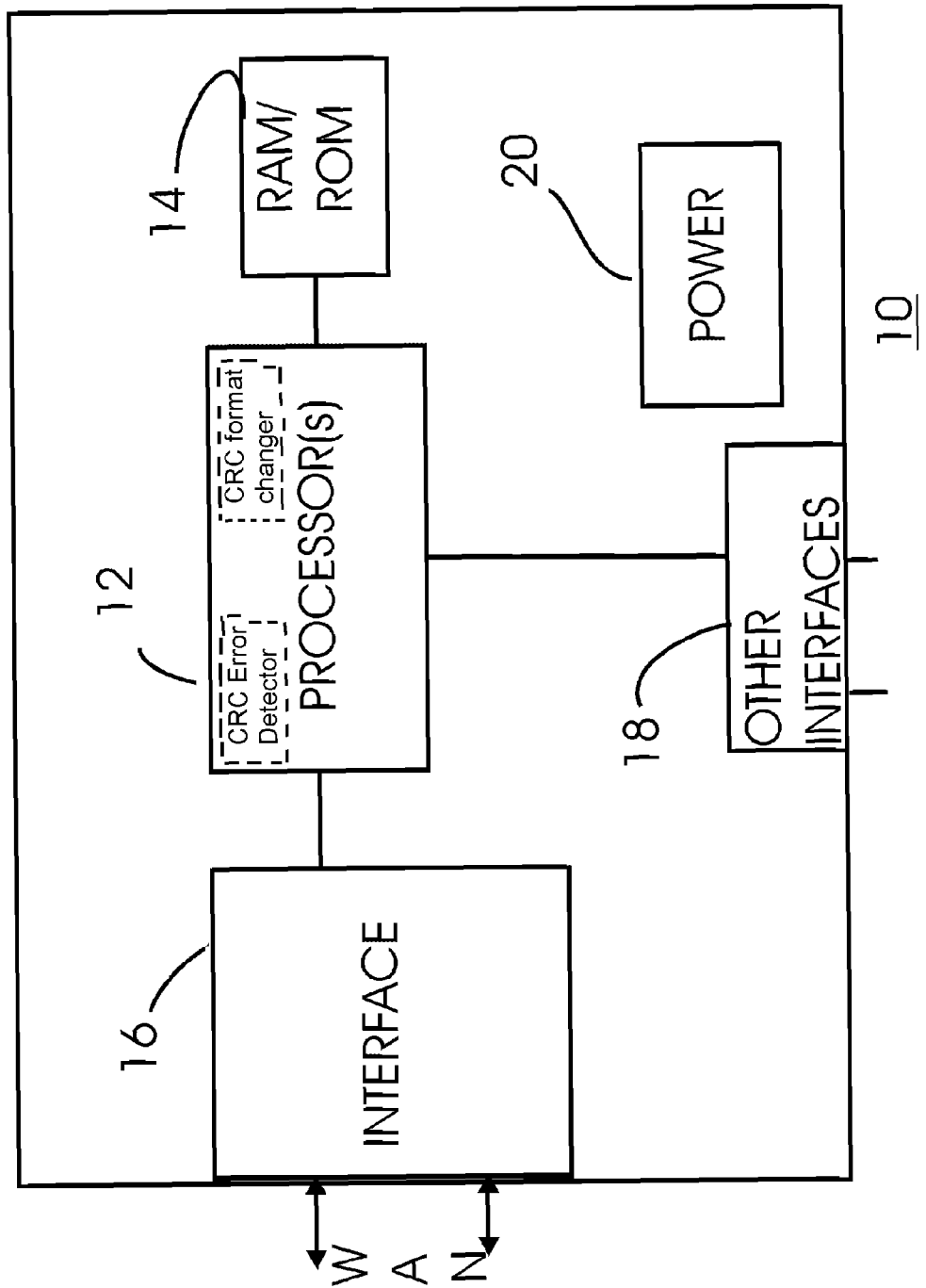
FIG. 1 is a block diagram of a WAN analyzer employing the invention therein.

Referring to FIG. 1, a block diagram of network test Instrument, e.g., a WAN (wide area network) analyzer 10 in accordance with the present invention, the analyzer suitably employs one or more microprocessors and/or programmable gate arrays 12, memory 14 (which may include RAM (random access memory), ROM (read only memory), flash memory, etc.), WAN interfaces 16, other interfaces 18 and power supply 20. The WAN interfaces and other interfaces convey data to and from the processors 12, wherein the processors implement a WAN analyzer. A display and input device may suitably be provided to display data and reports and show/enable configuration, but in a preferred embodiment, such display and i/o is suitably accomplished by interaction through interfaces 18 or 16, which allow another device, such as a computer running operation software or the like, to interact with the WAN analyzer and allow a user to configure and operate the analyzer.

In operation, data from the WAN is received via the interface (transmissions may also be made to the WAN) and are processed and analyzed by processors 12. The interface 16 handles any protection, data framing and other issues relevant to the particular type of network to which the instrument 10 is connected.

Figure 2:
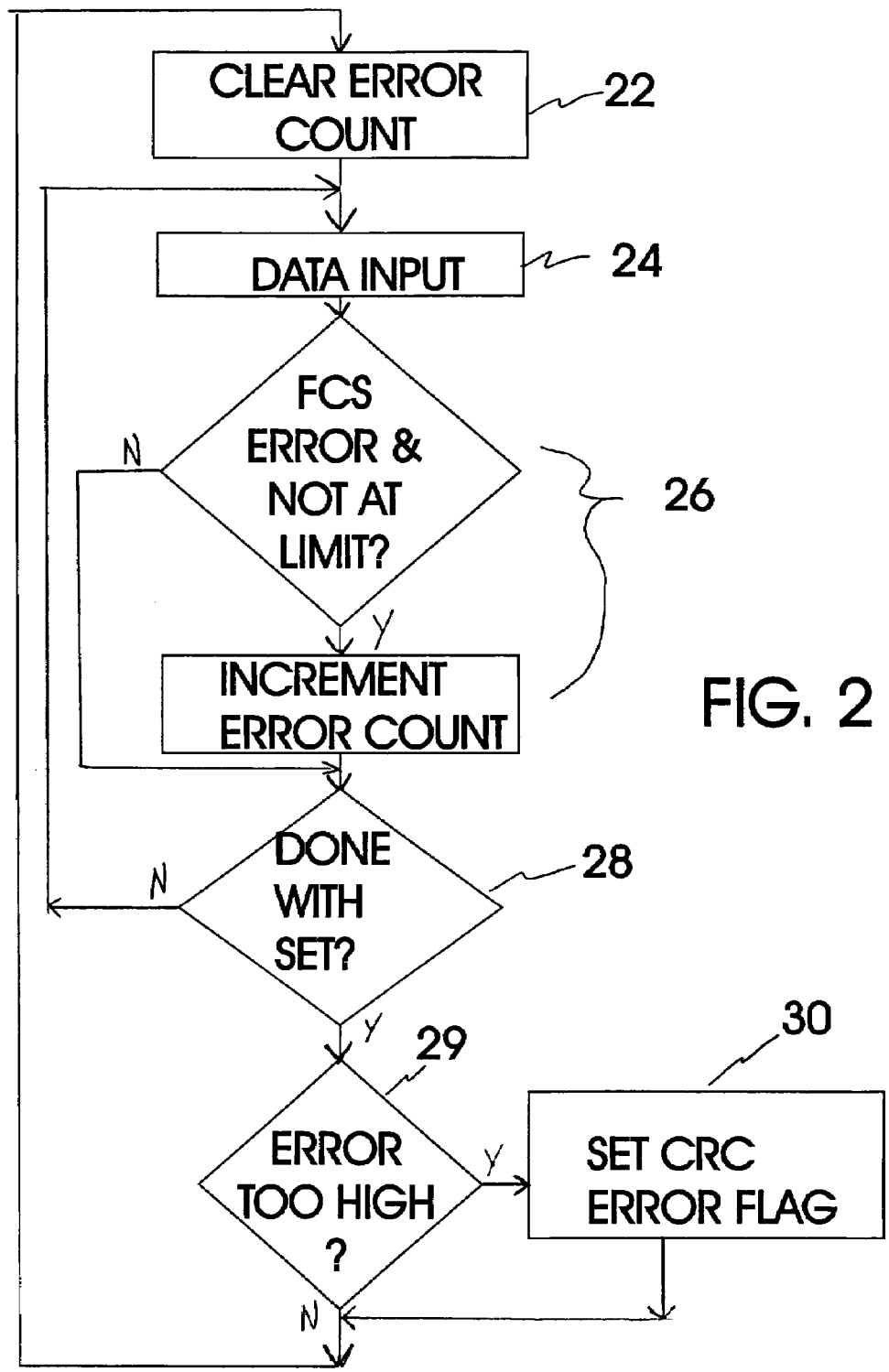
FIG. 2 is a flow chart of the error detection and counting process.

Referring now to FIG. 2, a flow chart of the error counting process, an error count is initially cleared (step 22). Data is input via the WAN interface (step 24) and at the end of a packet of data, a determination is made whether the packet had a FCS error. If so, and if the count of errors has not yet reached an error count limit (which may be, for example, 15), then the error count is incremented (step 26). The process then either continues to process more input data, or if a particular data set is complete, step 28, (which may be, for example, based on the passage of an amount of time, for example, 5 seconds) then a determination is made at whether the error count is too high, step 29, (which may be the above noted error count limit of 15, for example). If so, then a flag is set to indicate a CRC error (step 30). Then, whether an error condition was determined or not, the process continues back with step 22, to reset the error count and continue as noted above.

The setting of the error flag to indicate a CRC error is observable by the processors, and is used to decide whether to change the CRC from 16 to 32 bit or from 32 to 16 bit, for example.

Periodically, during operation, if the option of using automatic detection of CRC format is enabled, the processor or firmware will read the state of a CRC excessive error flag. If that flag is set, indicating that CRC errors were excessive over a particular period (which is, for example, 5 seconds), then the CRC setting can be automatically changed, which, as noted above, in the particular embodiment would involve switching from a 16 bit to a 32 bit CRC, or from a 32 bit to a 16 bit CRC. Other factors beyond the state of the CRC excessive error flag are also observed by the firmware in deciding whether to switch the CRC format. These other factors include physical layer decision factors, which may include physical layer errors such as loss of signal, loss of frame, framing errors, for example. These particular types of physical layer errors could present a false positive CRC error state. In view of this, if physical layer errors are present during the sampling period of the CRC counters, then the state of the CRC error count flag will not be used to make a switch of the CRC format.

In the illustrated embodiment, the analyzer monitors both sides of a full duplex link and a CRC excessive error count flag is provided for each side of the link. In operation, the frame check sequence CRC setting is considered incorrect (therefore warranting changing) if the side of the link with the most total frames (whether error frames or not) meets the test of the CRC excessive error count flag being set and the physical layer decision factors warranting observation of the CRC flag.

In operation, the firmware will initially set the CRC mode to be last detected or user-specified value, the assumption being that there is a likelihood that the analyzer will be used on a same or similar network as during the previous operation thereof.

The invention is suitably implemented via a FPGA (field programmable gate array) that performs the monitoring and counting of FCS errors and setting of the CRC error flag, and by firmware or software running on a processor that observes the state of the CRC error flag, and uses that flag value to decide whether to change the CRC format.

Accordingly, the invention suitably provides and automated setting of CRC format between two or more formats, suitably 16 and 32 bit in the illustrated embodiment. By use of the process and system, the user is freed from having to know what format the particular network employs and without having to know how to change the format settings.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A network test instrument, comprising:
    a CRC error detector for determining CRC errors; and
    a CRC format changer for selectively changing the CRC format in response to a determination by said CRC error detector,
    wherein said CRC format changer comprises a processor responsive to said CRC error detector, said processor changing CRC format settings if a determination is made that a sufficient level of CRC errors are occurring.

2. The network test instrument according to claim 1, wherein said network test instrument comprises a WAN analyzer.

3. A network test instrument, comprising:
    a CRC error detector for determining CRC errors, wherein said CRC error detector comprises a counter for counting FCS errors that occur during a particular interval;
    a CRC error flag that is set by said CRC error detector if a determination is made that said counter exceeds an error count threshold; and
    a CRC format changer for selectively changing the CRC format in response to a determination by said CRC error detector.

4. A network test instrument, comprising:
    a CRC error detector for determining CRC errors; and
    a CRC format changer for selectively changing the CRC format in response to a determination by said CRC error detector,
    wherein said CRC format is changed between a 16 bit CRC and a 32 bit CRC, and wherein if said CRC format is 16 bit during the period when said error is detected, said CRC format is changed to a 32 bit CRC.

5. The network test instrument according to claim 4, wherein if said CRC format is 32 bit during the period when said error is detected, said CRC format is changed to a 16 bit CRC.

6. A method of operating a network test instrument for automatically detecting CRC formats, comprising:
    observing a data stream received by the network test instrument and counting CRC errors using a first CRC format applied to the data stream;
    storing the count of CRC errors in a counter;
    after an interval, retrieving the count of CRC errors from said counter; and
    if the count of CRC errors exceeds a threshold during an interval, selectively changing the CRC format to a second CRC format in response to said count of CRC errors.

7. The method according to claim 6, wherein said step of counting CRC errors comprises employing said counter for counting FCS errors that occur during said interval.

8. The method according to claim 7 further comprising setting a CRC error flag if a determination is made that said counter exceeds an error count threshold.

9. The method according to claim 6, further comprising changing CRC format settings if a determination is made that a sufficient level of CRC errors are occurring.

10. The method according to claim 6, wherein said step of selectively changing CRC format comprises changing between a 16 bit CRC and a 32 bit CRC.

11. The method according to claim 10, wherein if said CRC format is 16 bit during said counting of CRC errors, said step of selectively changing CRC format comprises changing to a 32 bit CRC.

12. The method according to claim 10, wherein if said CRC format is 32 bit during said counting of CRC errors, said step of selectively changing CRC format comprises changing to a 16 bit CRC.

13. The method according to claim 6, wherein said method is performed by a WAN analyzer.

14. An automatic CRC format detection device, for detecting and switching between at least a 16 bit and a 32 bit CRC format, comprising:
    a CRC error detector for determining CRC errors in a data stream; and
    a CRC format changer for selectively changing the CRC format in response to a determination by said CRC error detectors,
    wherein said CRC format changer comprises a processor responsive to said CRC error detector, said processor changing CRC format settings if a determination is made that a sufficient level of CRC errors are occurring.

15. The automatic CRC format detection device according to claim 14, wherein said CRC error detector comprises a counter for counting FCS errors that occur during a particular interval.

16. The automatic CRC format detection device according to claim 15 further comprising a CRC error flag that is set by said CRC error detector if a determination is made that said counter exceeds and error count threshold.

* * * * *